United States Patent
Abbatiello et al.

(10) Patent No.: US 10,070,556 B1
(45) Date of Patent: Sep. 4, 2018

(54) METHODS AND SYSTEM FOR INTERNAL SHOCK ISOLATION

(71) Applicant: Dell Products L.P., Round Rock, TX (US)

(72) Inventors: Nicholas D. Abbatiello, Round Rock, TX (US); B. Bryce Busby, Round Rock, TX (US); Deeder M. Aurongzeb, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 15/463,129

(22) Filed: Mar. 20, 2017

Related U.S. Application Data

(63) Continuation of application No. 14/550,648, filed on Nov. 21, 2014, now Pat. No. 9,639,115.

(51) Int. Cl.
| | | |
|---|---|---|
| *G06F 1/16* | (2006.01) | |
| *H05K 5/00* | (2006.01) | |
| *H05K 7/00* | (2006.01) | |
| *H05K 7/14* | (2006.01) | |
| *B29C 45/16* | (2006.01) | |
| *B29K 69/00* | (2006.01) | |
| *B29K 21/00* | (2006.01) | |

(52) U.S. Cl.
CPC ....... *H05K 7/1495* (2013.01); *B29C 45/1676* (2013.01); *H05K 7/1487* (2013.01); *B29K 2021/003* (2013.01); *B29K 2069/00* (2013.01)

(58) Field of Classification Search
CPC .......................... H05K 7/1495; H05K 7/1487
USPC .......... 361/724–727, 679.34, 679.35, 679.36
See application file for complete search history.

(56) References Cited

U.S. PATENT DOCUMENTS

| | | | | | |
|---|---|---|---|---|---|
| 4,713,714 | A | * | 12/1987 | Gatti ..................... | G11B 33/08 248/581 |
| 5,041,924 | A | * | 8/1991 | Blackborow ............. | G06F 1/18 360/137 |
| 5,583,742 | A | * | 12/1996 | Noda .................... | G06F 1/1626 248/632 |
| 6,031,524 | A | | 2/2000 | Kunert | |
| 6,320,744 | B1 | * | 11/2001 | Sullivan ................. | G06F 1/184 312/223.2 |
| 6,567,265 | B1 | * | 5/2003 | Yamamura ............. | G11B 33/08 206/523 |
| 6,809,916 | B2 | * | 10/2004 | Nakata ................... | F16F 1/025 361/115 |
| 7,301,763 | B2 | * | 11/2007 | Hara ..................... | G11B 33/08 165/104.33 |
| 7,518,859 | B2 | * | 4/2009 | Kobayashi ............. | G11B 33/08 361/518 |
| 9,798,361 | B2 | * | 10/2017 | Kim ...................... | G06F 1/187 |

(Continued)

*Primary Examiner* — Anthony Haughton
(74) *Attorney, Agent, or Firm* — Baker Botts L.L.P.

(57) ABSTRACT

Methods and systems are disclosed for internal shock isolation in an information handling system. The method includes directing a tool to mold an outer frame of an information handling system, and directing the tool to mold an inner frame of the information handling system. The inner frame has a perimeter less than the perimeter of the outer frame. The method further includes directing the tool to construct a first plurality of braces in an interspatial area. The interspatial area is between the perimeter of the inner frame and the perimeter of the outer frame.

20 Claims, 4 Drawing Sheets

(56) References Cited

U.S. PATENT DOCUMENTS

| | | | |
|---|---|---|---|
| 2002/0044416 A1* | 4/2002 | Harmon, III | G11B 33/08 |
| | | | 361/679.36 |
| 2005/0257949 A1* | 11/2005 | Lalouette | G06F 1/184 |
| | | | 174/50 |
| 2006/0254997 A1 | 11/2006 | Pellegrino et al. | |
| 2011/0127891 A1 | 6/2011 | Cosgrove | |
| 2012/0183157 A1 | 7/2012 | Chen et al. | |
| 2012/0314354 A1* | 12/2012 | Rayner | H01H 13/06 |
| | | | 361/679.01 |
| 2014/0063728 A1* | 3/2014 | Iwamoto | G06F 1/187 |
| | | | 361/679.36 |

\* cited by examiner

METHODS AND SYSTEM FOR INTERNAL SHOCK ISOLATION

RELATED APPLICATIONS

This application is a continuation of U.S. patent application Ser. No. 14/550,648 filed Nov. 21, 2014, the contents of which is incorporated by reference herein.

TECHNICAL FIELD

This disclosure relates generally to information handling systems and, more particularly, to a system and method for internal shock isolation.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Advancements in packaging design have reduced both the weight and thickness of information handling systems. In particular, components included in portable information handling systems, such as laptops, notebooks, and tablet form factors, are the object of efforts to reduce weight and thickness, without compromising structural strength. Touchscreen displays are rapidly becoming a primary interface between a user and a portable information handling system and often include a display and a cover glass. Displays and cover glass are susceptible to breakage when portable information handling systems drop or fall and impact another surface, e.g., experience an "impact event." Upon impact, the cover glass may crack, shatter, or delaminate. Further, other portions of the information handling system may be dented or otherwise become damaged as a result of the impact event.

SUMMARY

In accordance with an embodiment of the present disclosure, a method of manufacturing an internal isolation system includes directing a tool to mold an outer frame of an information handling system, and directing the tool to mold an inner frame of the information handling system. The inner frame has a perimeter less than the perimeter of the outer frame. The method further includes directing the tool to construct a first plurality of braces in an interspatial area. The interspatial area is between the perimeter of the inner frame and the perimeter of the outer frame.

In accordance with another embodiment of the present disclosure, an internal isolation system for an information handling system includes an outer frame of an information handling system and an inner frame of the information handling system. The inner frame has a perimeter less than the perimeter of the outer frame. The system also includes a first plurality of braces in an interspatial area. The interspatial area is between the perimeter of the inner frame and the perimeter of the outer frame.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

In the following description, details are set forth by way of example to facilitate discussion of the disclosed subject matter. It should be apparent to a person of ordinary skill in the field, however, that the disclosed embodiments are exemplary and not exhaustive of all possible embodiments.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage resource, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such wires, optical fibers, microwaves, radio waves, and other electromagnetic and/or optical carriers; and/or any combination of the foregoing.

Figure 1:
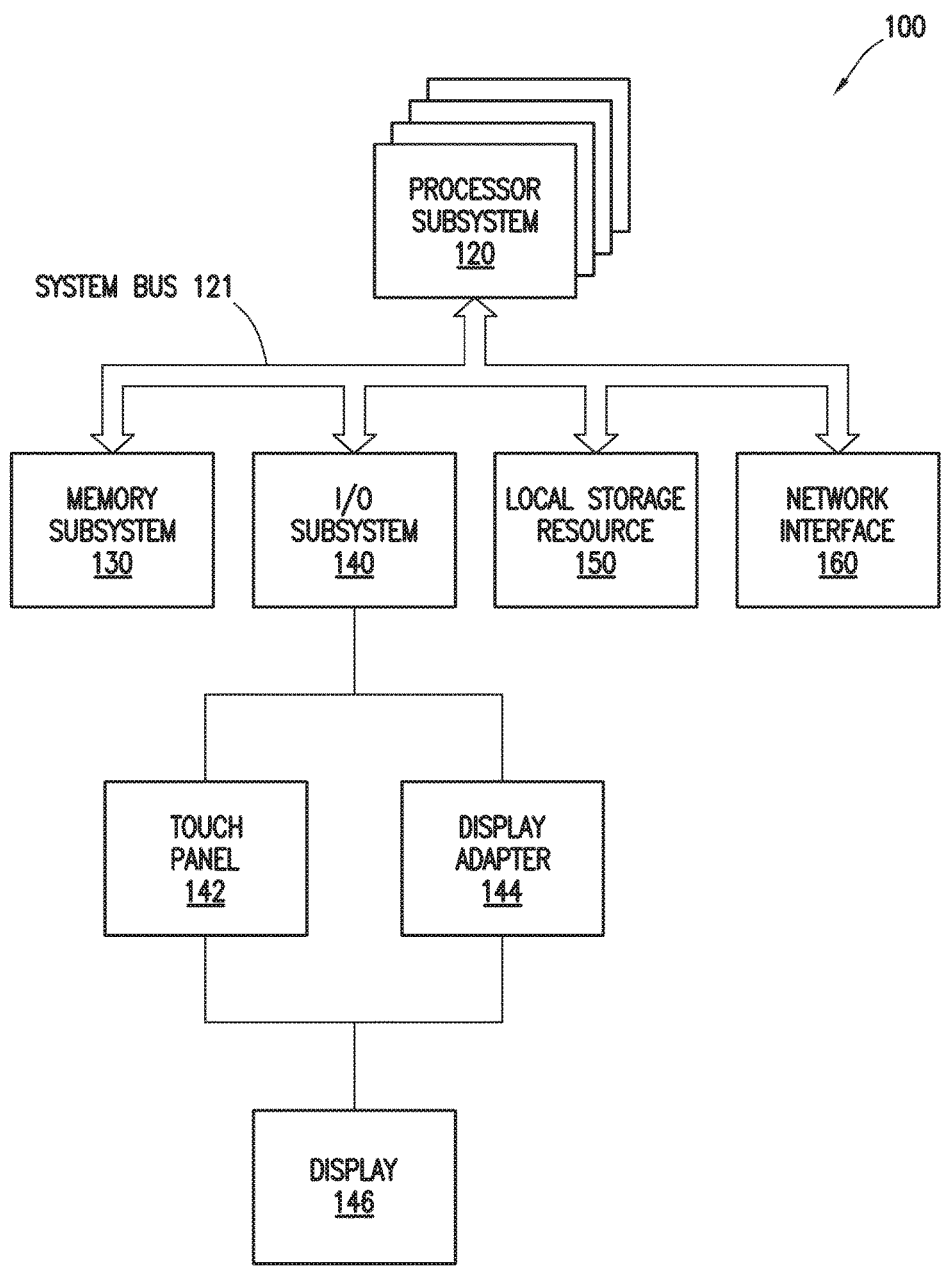
FIG. 1 illustrates a block diagram of an example information handling system in accordance with some embodiments of the present disclosure.

FIG. 1 illustrates a block diagram of an example information handling system 100 in accordance with some embodiments of the present disclosure. Information handling system 100 may generally be operable to receive data from, and/or transmit data to, other information handling systems 100. Information handling system 100 may be a laptop computer, a desktop computer, a tablet computer, a 2-in-1 device, a personal digital assistant (PDA), a mobile phone, or any similar device. For example, information handling system 100 may be a tablet.

As shown in FIG. 1, components of information handling system 100 may include, but are not limited to, processor subsystem 120, which may comprise one or more processors, and system bus 121 that communicatively couples various system components to processor subsystem 120 including, for example, a memory subsystem 130, an I/O subsystem 140, local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

Processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of physical hardware 102). In the same or alternative embodiments, processor subsystem 120 may interpret and/or execute program instructions and/or process data stored remotely (e.g., in network storage resource 170).

Memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down. Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, network storage resource 170 may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data. In system 100, I/O subsystem 140 may comprise a system, device, or apparatus generally operable to receive and/or transmit data to/from/within system 100. I/O subsystem 140 may represent, for example, a variety of communication interfaces, graphics interfaces, video interfaces, user input interfaces, and/or peripheral interfaces. As shown, I/O subsystem 140 may comprise touch panel 142 and display adapter 144. Touch panel 142 may include circuitry for enabling touch functionality in conjunction with display 146 that is driven by display adapter 144. As shown, display 146 may include a display cover or display glass.

In FIG. 1, network interface 160 may be a suitable system, apparatus, or device operable to serve as an interface between information handling system 100 and a network. Network interface 160 may enable information handling system 100 to communicate over a network using a suitable transmission protocol and/or standard. A network may include, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data).

In some embodiments, information handling system 100 may be a portable information handling system, such as a tablet. A portable Information handling system may be designed to withstand an impact event, e.g., dropping or falling. For example, using a portable information handling system in a hospital or educational environment may result in situations where the portable system is susceptible to damage due to dropping. One approach to increasing durability of portable information handling systems may be to strengthen the enclosure such that the enclosure experiences the brunt of the impact. For example, a ruggedized notebook or tablet may utilize this approach. However, strengthening the enclosure may not be the most advantageous method for minimizing damage to a portable information handling system during an impact event. For example, a corner drop test of a tablet may reveal that, due to the rigidity of the enclosure, a tablet bends backwards and puts the cover glass in tension causing the glass to break. Further, during a face drop test of a tablet, the cover glass may delaminate from the rest of the portable information handling system. Moreover, a ruggedized product may include an external case, appear bulky, increase weight, and may not be aesthetically suitable for some applications.

Thus, in some embodiments, a system and method for improved durability of a portable information handling system is described. In some embodiments, durability may be improved in the absence of ruggedized components such as an external case. The present disclosure utilizes multiple frames, e.g., an inner frame and an outer frame, to allow the display and cover glass to float or be isolated from the shock of the impact energy. However, the system is rigid such that, during use, a user may not notice the inner frame moving relative to the outer frame.

Figure 2:
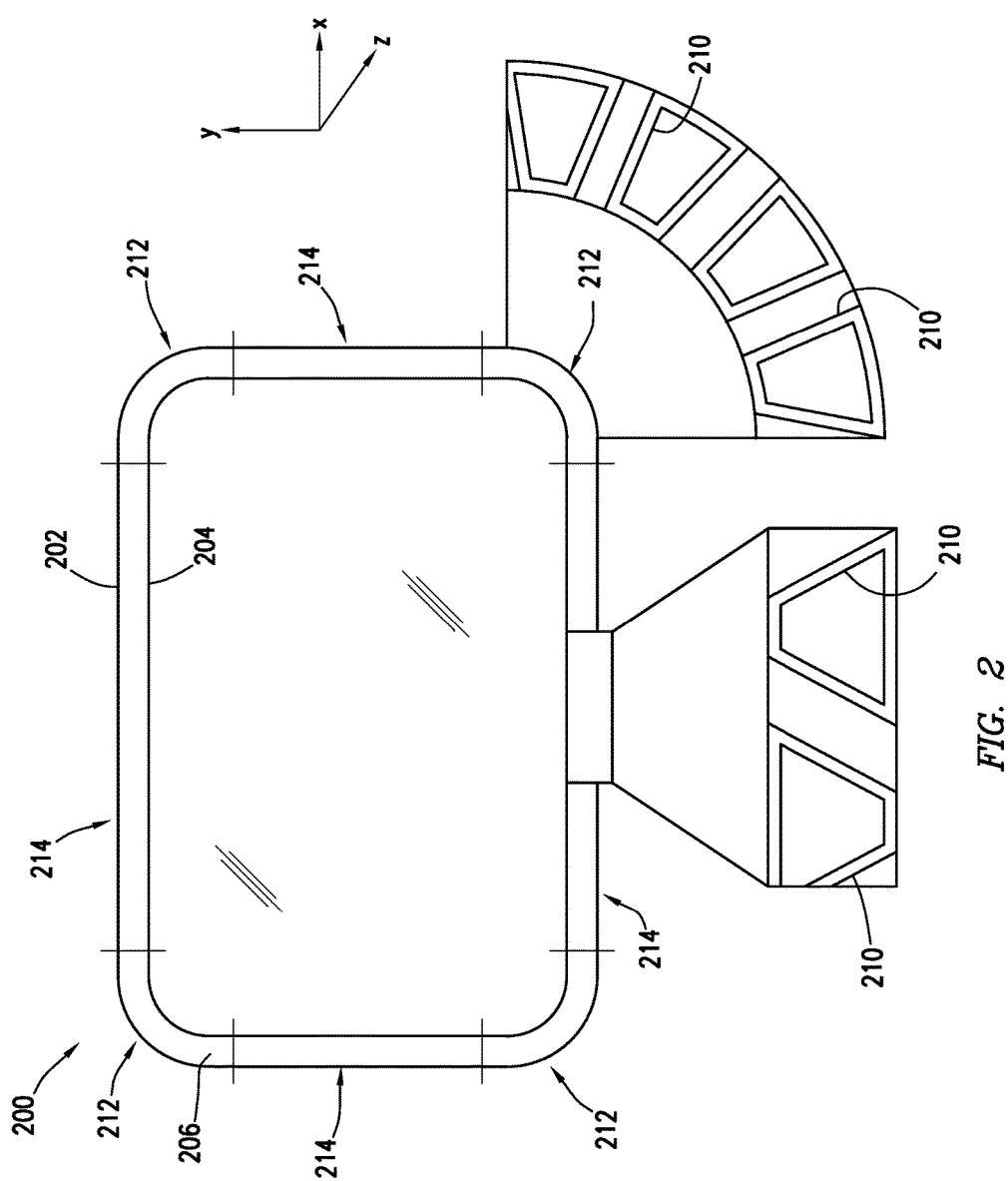
FIG. 2 illustrates an example portable information handling system with an internal shock isolation system in accordance with some embodiments of the present disclosure.

FIG. 2 illustrates an example portable information handling system 200 with an internal shock isolation system in accordance with some embodiments of the present disclosure. Portable information handling system 200 includes outer frame 202, inner frame 204, and interspatial area 206.

Outer frame 202 may be configured to support and provide structure to components of portable information handling system 200. Outer frame 202 may be of any suitable size as needed for the application. Outer frame 202 may be constructed of an impact resistant material, such as a polymer or polycarbonate. Outer frame 202 may have a thickness that provides the appropriate amount of strength and rigidity. For example, outer frame 202 may be approximately one millimeter (mm) thick.

Inner frame 204 may be configured to fit inside the dimensions of outer frame 202 and allow for interspatial area 206. As such, the perimeter of inner frame 204 may be less than the perimeter of outer frame 202. Inner frame 204 may include the elements of information handling system 100 described above with reference to FIG. 1. For example, inner frame 204 may have mounted or configured in it processor subsystem 120, system bus 121, memory subsystem 130, I/O subsystem 140, local storage resource 150, network interface 160, and/or any other suitable devices utilized in information handling system 100. Inner frame 204 may be constructed of reinforced plastic, magnesium, or other suitable material. Inner frame 204 may be configured to fit inside the dimensions of outer frame 202 while allowing for sufficient thickness for interspatial area 206.

Interspatial area 206 may include a material or structure that allows inner frame 204 to move relative to outer frame 202 in both the x-axis and y-axis directions. Interspatial area 206 may be a gap that is filled with air or any other suitable medium, and may include one or multiple braces 210. Braces 210 may function to absorb the energy by allowing and arresting the movement of inner frame 204 during an impact event. Braces 210 may be of any suitable shape and/or orientation. For example, the shape of braces 210 may be substantially circular, oval, quadrilateral, such as a trapezoidal shape as shown in FIG. 2, an I-beam, or any other suitable shape. Braces 210 may be construed of a material that is capable of absorbing or dissipating impact energy. A design consideration may include maximizing the tan delta or loss factor of the material to dissipate impact energy perpendicular to the impact direction into a safer form of energy, such as heat. For example, braces 210 may be construed of an elastomeric material, such as VERSAFLEX Thermoplastic Elastomer manufactured by PolyOne Corp. (McHenry, Ill.).

In some embodiments, braces 210 may be placed throughout interspatial area 206. Braces 210 may be configured such that adjacent braces 210 may be separated by a predefined separation space. In some embodiments, the separation space may be approximately similar throughout interspatial area 206. In some embodiments, the separation space may be dissimilar based on the location in the interspatial area 206 of a particular brace 210. For example, in corner areas 212, braces 210 may be more closely spaced than in side areas 214. Close spacing of braces 210 in corner areas may improve the ability of portable information handling system 200 to remain undamaged when subject to a corner drop or corner impact event.

In some embodiments, the configuration, dimensions, material properties, and location of braces 210 may be based on design considerations including the environment that portable information handling system 200 may be used. Calculations may be performed to determine appropriate configurations, dimensions, material properties, and locations for braces 210. The following exemplary analysis of braces 210 may be performed in an iterative manner to determine the appropriate characteristics. Energy to be dissipated from a drop may be represented by:

$$E_{drop} = mass * gravity * height \quad (1)$$

where:
mass=mass of portable information handling system;
height=height of drop; and
gravity=9.81 m/s$^2$.

As example, the energy generated by a drop ($E_{drop}$) of an approximately 0.45 kilogram (kg) tablet from a height of approximately 2 meters is 8.83 Newton*meters (Nm). Equation (1) assumes a rigid drop surface.

In some embodiments, the potential energy of braces 210 is designed to be approximately the energy generated by the drop $E_{drop}$. Treating braces 210 as a spring:

$$E_{spring} = K * x^2 \quad (2)$$

where:
K=spring constant; and
x=displacement of the spring.
Solving for the spring constant:

$$K_{system} = E_{drop}/x^2.$$

As example, if the distance between inner frame 204 and outer frame 202, e.g., thickness, t, of interspatial area 206, is set at approximately 10 mm, then 10 mm is also the maximum displacement of the spring, x. Thus, $K_{system}$=8.83 Nm/(0.01 m)$^2$=88300 N/m.

As example, a design may assume that corner area 212 can include 10 individual braces 210. Thus, the spring constant for each brace 210 may be:

$$K_{spring} = K_{system}/10 \quad (3).$$

Further, $K_{spring}$ may also be expressed as:

$$K_{spring} = (E_{dynamic} * l * w)/t$$

where:
$E_{dynamic}$=the dynamic modulus of the elastomer that constitutes brace 210;
l=length of brace 210; and
w=width of brace 210.
Solving for $E_{dynamic}$:

$$E_{dynamic} = (K_{spring} * t)/(l * w) \quad (4).$$

As example, the length of brace 210 may be approximately 7 mm and width may be approximately 2 mm. Thus, $E_{dynamic}$=(8830 N/m*0.01 m)/(0.007 m*0.002 m)=630,714 Pascals (Pa). Accordingly, the material selected for braces 210 with the selected geometry may require a dynamic modulus of approximately 0.63 MPa. Any parameter of the foregoing exemplary analysis may be modified and further calculation may be completed in some embodiments of the present disclosure.

Figure 3:
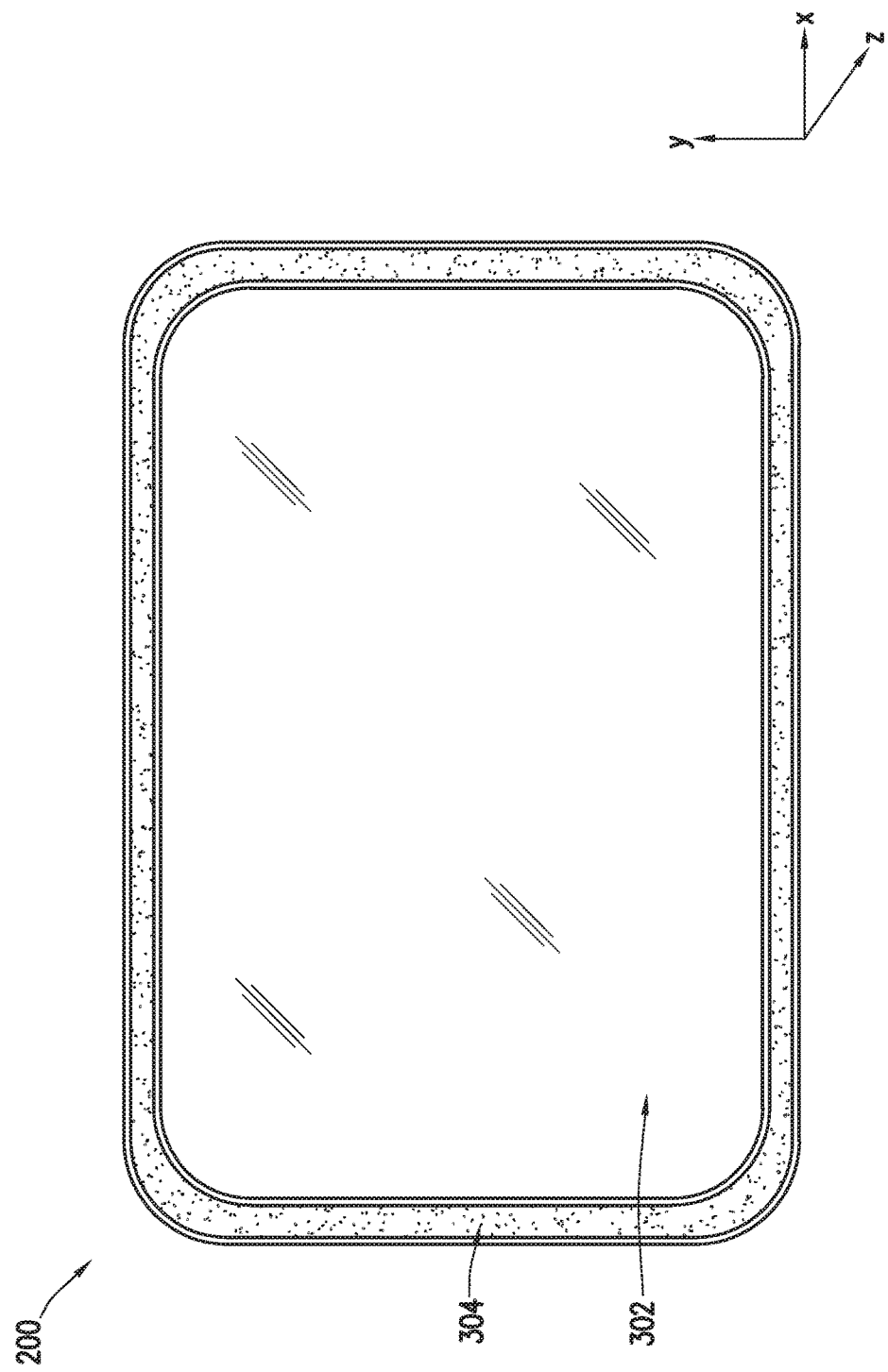
FIG. 3 illustrates an example front view of a portable information handling system with an internal shock isolation system in accordance with some embodiments of the present disclosure.

FIG. 3 illustrates an example front view of portable information handling system 200 with an internal shock isolation system in accordance with some embodiments of the present disclosure. Portable information handling system 200 may include cover glass 302 and skin 304. Cover glass 302 may include one or multiple glass sheets or other suitable material. Cover glass 302 may be configured to match the exterior dimensions of inner frame 204, discussed with reference to FIG. 2. For example, cover glass 302 may have an appropriate size and thickness, such as approximately fifty microns.

Skin 304 may be configured to cover interspatial area 206 and couple inner frame 204 with outer frame 202. Skin 304 may be constructed of any suitable material, for example elastomeric material. Skin 304 may serve as a cosmetic surface and provide isolation for face drops or face impact events. As such, skin 304 may allow the inner frame 204 to move in the z-axis direction relative to outer frame 202 during a face drop or face impact event.

Figure 4:
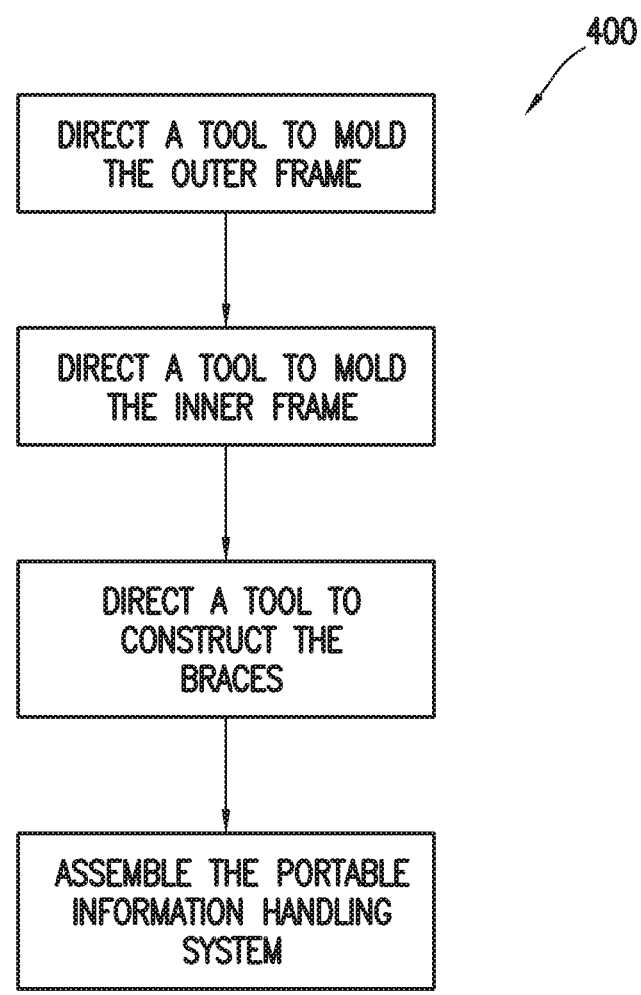
FIG. 4 illustrates a flowchart of an example manufacturing method for an internal shock isolation system in a portable information handling system in accordance with some embodiments of the present disclosure.

FIG. 4 illustrates a flowchart of an example manufacturing method 400 for an internal shock isolation system in a portable information handling system in accordance with some embodiments of the present disclosure. The steps of method 400 may be performed by various computer programs, models or any combination thereof. The programs and models may include instructions stored on a computer-readable medium that are operable to perform, when executed, one or more of the steps described below. The computer-readable medium may include any system, apparatus or device configured to store and/or retrieve programs or instructions such as a microprocessor, a memory, a disk controller, a compact disc, flash memory or any other suitable device. The programs and models may be configured to direct a processor or other suitable unit to retrieve and/or execute the instructions from the computer-readable medium. For example, method 400 may be executed by a manufacturing system and/or other suitable source. For illustrative purposes, method 400 may be described with respect to manufacturing the internal shock isolation of portable information handling system 200 of FIG. 2; however, method 400 may be used for manufacturing an internal shock isolation system of any suitable configuration.

At step 405, the manufacturing system directs a tool to mold the outer frame. For example, outer frame 202 may be molded from impact resistant material such as LEXAN Resin (polycarbonate). The manufacturing system may direct an injection molding tool to mold the outer frame based on final dimensions determined for outer frame 202, such as a thickness of approximately 1.5 mm or less. The thickness of outer frame 202 may be minimized to allow for energy to be transmitted to braces 210.

At step 410, the manufacturing system directs a tool to mold the inner frame. For example, inner frame 204 may be molded from reinforced plastic, magnesium, or other suitable material.

At step 415, the manufacturing system directs a tool to construct the braces. Outer frame 202 and inner frame 204 may be placed into an injection molding tool. The front of outer frame 202 and inner frame 204 may face the cavity side of the injection molding tool. The injection molding tool may be closed on both frames and material to construct braces 210 may be injected. For example, a thermoplastic elastomeric material (TPE) may be injected. The material for braces 210 may be injected based on a design for the configuration, dimensions, material properties, and location of braces 210 determined by the use of Equations (1)-(4) discussed with reference to FIG. 2. Once the material for braces 210 (e.g., TPE material) is cooled below the glass transition temperature ($T_g$), inner frame 204 and outer frame 206 may be coupled and removed from the injection molding tool. In some embodiments, locking mechanisms may be included in the molding of inner frame 204 and outer frame 202, such that the TPE or other suitable material flows around the locking mechanism and creates a mechanical bond.

At step 420, the manufacturing system assembles the portable information handling system. For example, the elements described with reference to FIG. 1 may be installed within inner frame 204.

Modifications, additions, or omissions may be made to method 400 without departing from the scope of the present disclosure and invention. For example, the order of the steps may be performed in a different manner than that described and some steps may be performed at the same time. For example, step 405 and 410 may be performed simultaneously. Additionally, each individual step may include additional steps without departing from the scope of the present disclosure.

Although the present disclosure and its advantages have been described in detail, it should be understood that various changes, substitutions and alternations can be made herein without departing from the spirit and scope of the disclosure as defined by the following claims.

What is claimed is:

1. An internal isolation system comprising:
   an outer frame of an information handling system;
   an inner frame of the information handling system, the inner frame having a perimeter less than the perimeter of the outer frame;
   a first plurality of braces in a corner portion of an interspatial area, the interspatial area between the perimeter of the inner frame and the perimeter of the outer frame; and
   a skin covering the interspatial area and coupling the inner frame with the outer frame;
   wherein the first plurality of braces allows the inner frame to move relative to the outer frame in an x-axis direction and in a y-axis direction; and
   wherein the skin isolates the inner frame and the outer frame in a z-axis direction.

2. The system of claim 1, wherein the first plurality of braces includes a separation space between adjacent braces.

3. The system of claim 2, wherein the separation space between each adjacent brace is approximately equal.

4. The system of claim 1, further comprising a second plurality of braces located in a side portion of the interspatial area.

5. The system of claim 4, wherein the first plurality of braces includes a first separation space between adjacent braces; the second plurality of braces includes a second separation space between adjacent braces, and the first separation space is less than the second separation space.

6. The system of claim 1, wherein the first plurality of braces are shaped as trapezoids.

7. The system of claim 1, wherein the first plurality of braces are shaped as I-beams.

8. The system of claim 1, wherein the first plurality of braces are constructed of thermoplastic elastomer material.

9. The system of claim 1, wherein the configuration of the first plurality of braces is based on a dynamic modulus.

10. The system of claim 1, wherein the interspatial area has a consistent thickness.

11. An internal isolation system comprising:
    an outer frame of an information handling system;
    an inner frame of the information handling system, the inner frame having a perimeter less than the perimeter of the outer frame;
    a first plurality of braces in an interspatial area, the interspatial area between the perimeter of the inner frame and the perimeter of the outer frame; and
    a component of the information handling system assembled in the inner frame; and
    a skin covering the interspatial area and coupling the inner frame with the outer frame;
    wherein the first plurality of braces allows the inner frame to move relative to the outer frame in an x-axis direction and in a y-axis direction; and wherein the skin isolates the inner frame and the outer frame in a z-axis direction.

12. The system of claim 11, wherein the first plurality of braces includes a separation space between adjacent braces.

13. The system of claim 12, wherein the separation space between each adjacent brace is approximately equal.

14. The system of claim 11, further comprising a second plurality of braces in the interspatial area, wherein the first plurality of braces are located in a corner portion of the interspatial area and the second plurality of braces are located in a side portion of the interspatial area.

15. The system of claim 14, wherein the first plurality of braces includes a first separation space between adjacent braces; the second plurality of braces includes a second separation space between adjacent braces, and the first separation space is less than the second separation space.

16. The system of claim 11, wherein the first plurality of braces are shaped as trapezoids.

17. The system of claim 11, wherein the first plurality of braces are shaped as I-beams.

18. The system of claim 11, wherein the first plurality of braces are constructed of thermoplastic elastomer material.

19. The system of claim 11, wherein the configuration of the first plurality of braces is based on a dynamic modulus.

20. The system of claim 11, wherein the interspatial area has a consistent thickness.

* * * * *